(12) United States Patent
Ramezani

(10) Patent No.: US 10,955,304 B2
(45) Date of Patent: Mar. 23, 2021

(54) N-IMPLANT ELECTRICAL SHIELD FOR PIEZO-RESISTOR SENSOR

(71) Applicant: Melexis Technologies NV, Tessenderlo (BE)

(72) Inventor: Maliheh Ramezani, Leuven (BE)

(73) Assignee: Melexis Technologies NV, Tessenderlo (BE)

( * ) Notice: Subject to any disclaimer, the term of this patent is extended or adjusted under 35 U.S.C. 154(b) by 11 days.

(21) Appl. No.: 16/440,130

(22) Filed: Jun. 13, 2019

(65) Prior Publication Data
US 2019/0383683 A1  Dec. 19, 2019

(30) Foreign Application Priority Data
Jun. 14, 2018  (EP) ..................... 18177886

(51) Int. Cl.
*G01L 9/00* (2006.01)
*H01L 21/22* (2006.01)
(Continued)

(52) U.S. Cl.
CPC .......... *G01L 9/0042* (2013.01); *B81B 7/0009* (2013.01); *G01L 9/0052* (2013.01); *H01L 21/22* (2013.01); *H01L 29/84* (2013.01)

(58) Field of Classification Search
CPC ..... G01L 1/18; G01L 1/16; G01L 9/08; G01L 9/0042; G01L 9/0052; G01L 5/162;
(Continued)

(56) References Cited

U.S. PATENT DOCUMENTS

| 4,125,820 A | 11/1978 | Marshall |
| 6,933,582 B2 * | 8/2005 | Ishio ..................... G01L 9/0054 257/414 |

(Continued)

FOREIGN PATENT DOCUMENTS

| JP | H06207871 A | 7/1994 |
| JP | 3225622 B2 | 8/2001 |

OTHER PUBLICATIONS

Åsmund Sandvand, "High-Stability Piezoresistive Pressure Sensors," University College of Southeast Norway, Doctoral Dissertation No. 25, Aug. 2017.
(Continued)

*Primary Examiner* — Yasser A Abdelaziez
(74) *Attorney, Agent, or Firm* — Workman Nydegger

(57) ABSTRACT

A piezo-resistor-based sensor, and a method to fabricate such sensor, comprise a sensor having at least a sensing element provided on a flexible structure, such as a membrane or cantilever or the like. The sensing element includes at least one piezo-resistor comprising at least a first region of the flexible structure doped with dopant atoms of a first type. The flexible structure furthermore comprises a second doped region within it, at least partially overlapping the first doped region, forming a shield for shielding the sensing element from external electrical field interference, wherein dopant atoms of the second doped region are of a second type opposite to the dopant atoms of the first doped region, for generating a charge depletion layer within the flexible structure at the overlapping region between the first doped region and the second doped region.

13 Claims, 5 Drawing Sheets

(51) Int. Cl.
*H01L 29/84* (2006.01)
*B81B 7/00* (2006.01)

(58) Field of Classification Search
CPC ..... H01L 41/1132; H01L 41/22; H01L 21/22; H01L 29/84; B81B 7/0009
See application file for complete search history.

(56) References Cited

U.S. PATENT DOCUMENTS

| | | |
|---|---|---|
| 6,952,042 B2 | 10/2005 | Stratton et al. |
| 2014/0319630 A1* | 10/2014 | Conti ................... H04R 19/005 257/416 |
| 2015/0008544 A1 | 1/2015 | Yazawa et al. |
| 2018/0218984 A1* | 8/2018 | Van Der Wiel ..... H01L 23/5226 |
| 2018/0277901 A1* | 9/2018 | Mochizuki ........ H01M 10/0585 |

OTHER PUBLICATIONS

Extended European Search Report for EP Application No. 18177886. 1, Nov. 28, 2018.

* cited by examiner

N-IMPLANT ELECTRICAL SHIELD FOR PIEZO-RESISTOR SENSOR

FIELD OF THE INVENTION

The invention relates to the field of piezoresistive sensors. More specifically, it relates to shielding for piezoresistive pressure sensors.

BACKGROUND OF THE INVENTION

Sensitivity of sensors indicates the level of response with respect to a stimulus. Ideally, sensitivity should be constant throughout the useful life of a sensor. However, sensitivity of some types of pressure sensors may suffer from changes with time. For example, pressure sensors for gas, comprising a membrane and an element which changes its electrical characteristics with deformation of the membrane, usually suffer from drift due to external electric fields or surface charges which may affect the element. In particular, silicon piezoresistive pressure sensors suffer from start-up drift due to external electric fields, surface charges or static charge accumulation on the sensing element and therefore the change in the piezo-resistors' dopant distribution. This is especially problematic in automotive applications. The charges may have come from environment such as from oil full of ions, which is in contact with pressure sensor, or may have been created in passivation layer due to external electrical field or thermal energies. The charges migrate to the piezo-elements, causing effective resistance changes and therefore sensor output drifting.

Usually, an extra layer of shielding material can be deposited on top of the membrane, to reduce EM interference and/or charges falling on the sensitive parts of the element such as the membrane and/or the piezo-elements. However, deposition of material (e.g. polysilicon) is usually performed at very high temperatures, which may induce mechanical stress during cooling. This may affect membrane initial stress, thus introducing an initial offset, which affects the sensitivity. For example, due to mechanical stress, 100-150 nm of metal can reduce sensitivity up to 5% for a 7 μm Si membrane. Additionally, due to the thickness of the shield, the thickness of the membrane increases as much, which usually increases the stiffness of the membrane and further reduces its sensitivity. Non-linear behavior and hysteresis problems may also arise.

U.S. Pat. No. 6,952,042 discloses a metallic shield on top of a membrane. The shield includes a predetermined thickness of deposited doped polysilicon. Not only is the thickness of the membrane increased (with the corresponding reduction of sensitivity), but also is the shield usually required to be electrically isolated from the sensing element. This electrical isolation increases the thickness even further, thus reducing the sensitivity even more. Furthermore, a complex processing with a lengthy manufacturing route is required including many steps, patterning, masking, etching, etc., in order to reduce as much as possible the harmful effects of the shielding on the sensor.

SUMMARY OF THE INVENTION

It is an object of embodiments of the present invention to provide an effective protection against external interference and to reduce the effect of surface charges on pressure sensors with reduced or no need of increasing the thickness of the sensing elements.

In a first aspect, the present invention relates to a piezo-resistor-based sensor comprising at least a sensing element provided on a flexible structure, e.g. a moveable structure such as a membrane or a cantilever. The sensing element comprises at least one piezo-resistor comprising at least a first region of the flexible structure doped with dopant atoms of a first type. The flexible structure furthermore comprises a second doped region within it, at least partially overlapping the first doped region, thereby forming a shield for shielding the sensing element from external electrical field interference, wherein dopant atoms of the second doped region are of a second type opposite to the type of dopant atoms of the first doped region, for generating a charge depletion layer within the flexible structure at the overlapping region between the first doped region and the second doped region.

It is an advantage of embodiments of the present invention that a sensor with very low or no residual stress and output drift is obtained. It is a further advantage that the flexible structure (e.g. membrane) does not increase its thickness due to the shielding, keeping its sensitivity.

In embodiments of the present invention, the second doped region extends over the area of the flexible structure outside the first doped region, overlapping at least part of the flexible structure outside the first doped region of the piezo-resistors.

It is an advantage of embodiments of the present invention that the shield can be provided on more than one piezo-resistor simultaneously. It is a further advantage that irregularities on the flexible structure due to strong doping gradients can be reduced.

In embodiments of the present invention, the sensing element comprises the first doped region comprising silicon doped with boron, and the shield comprises the second region doped (e.g. with phosphorus, the present invention not being limited thereto).

It is an advantage of embodiments of the present invention that the shielding is embedded in the flexible structure.

In embodiments of the present invention, the shield is in electrical contact with an exterior of the flexible structure.

It is an advantage of embodiments of the present invention that, by way of contact vias and metal vias, the floating charges on the surface of the flexible structure can be reduced.

In embodiments of the present invention, the shield is not covering areas adjacent to highly doped regions of the flexible structure, used for interconnection with the piezo-resistors.

It is an advantage of embodiments of the present invention that the risk of breakdown of the device is reduced.

In embodiments of the present invention, the sensor further comprises a protective layer comprising corrosion resistant material provided on top of at least the flexible structure.

It is an advantage of embodiments of the present invention that degradation is reduced or prevented.

In a further aspect, the present invention relates to a method of manufacturing a pressure sensor. The method comprises the steps of:

providing at least a piezo-resistor comprising dopant atoms of a first type in a first region of a sheet of material, providing a shield comprising dopant atoms of second type, opposite to the first type, in a second region of the sheet at least partially overlapping the first region thereby generating a charge depletion layer between the first doped region and the second doped region, for shielding against disturbances, providing the sheet on a substrate with a cavity, such that at least the first region of the sheet overlaps the cavity, thereby obtaining a flexible structure as sensing element of the pressure sensor.

It is an advantage of embodiments of the present invention that this type of shielding is not inducing any initial stress in the sheet of material.

In embodiments of the present invention, providing the piezo-resistors comprises implanting and diffusing the dopant atoms of the first type, and providing the shield comprises implanting and diffusing dopant atoms of the second type.

In embodiments of the present invention, the method further comprises providing a doped well around the flexible structure, and providing an electric contact between the well and the shield.

It is an advantage of embodiments of the present invention that floating charges on the shield can be flushed away with no need of providing a further connection between the shield and an output or ground.

In embodiments of the present invention including providing the doped well, providing the shield comprises providing dopant atoms of the second type in the second doped region of the sheet simultaneously with providing the doped well.

It is an advantage of embodiments of the present invention that the well and shield can be provided at the same time, reducing the number of doping and diffusion steps.

In embodiments of the present invention, providing the shield comprises providing dopant atoms in a region extending throughout a predetermined area of the sheet, overlapping at least part of the sheet outside the first doped region.

It is an advantage of embodiments of the present invention that all the piezo-resistors can be covered at once by the shield, including zones of the flexible structure between the piezo-resistors, thereby reducing irregularities or changes of thickness due to doping gradients.

In embodiments of the present invention, the method comprises providing connection regions in a sub-region of the first region, and wherein providing the shield comprises leaving a gap between the second region and the connection regions.

It is an advantage of embodiments of the present invention that chances of early breakdown are reduced.

In embodiments of the present invention, the method comprises providing connections and electrical paths in the zones of the sheet in contact with the substrate, outside the flexible structure, by providing highly doped regions.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
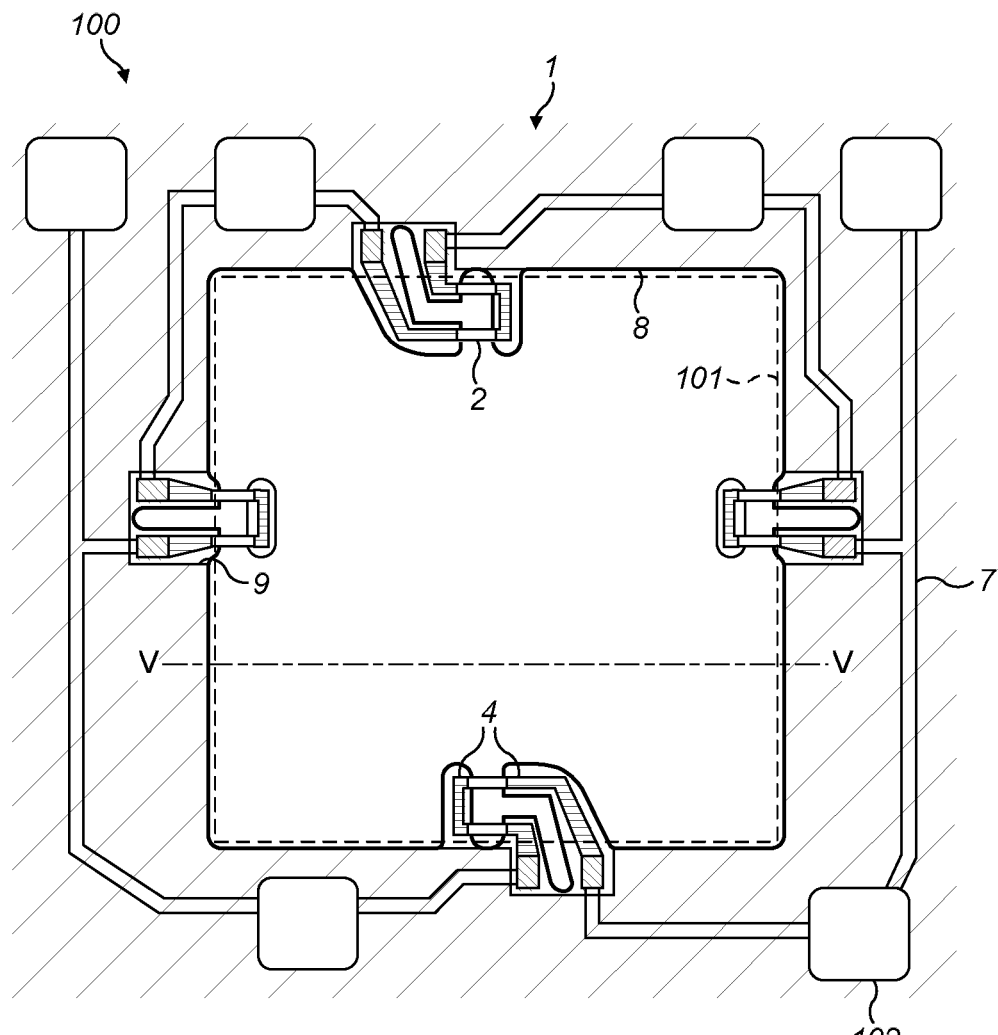
FIG. 1 illustrates a top view of a gas pressure sensor according to embodiments of the present invention.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be not drawn on scale for illustrative purposes. The dimensions and the relative dimensions do not correspond to actual reductions to practice of the invention.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in embodiments of the present invention reference is made to a "membrane", reference is made to the part of a sheet of material being supported by edges of a substrate. For example, a sheet of material may be placed on the surface of a substrate which includes a hollowed region, or pit. The membrane will be considered the part of the sheet overlapping the pit, e.g. covering the pit. Such hollowed region receives the name of "cavity" in embodiments of the present invention. However, the present invention is not limited to embodiments having a sheet over a cavity; other movable or flexible structures can be applied to the present invention instead of a sheet membrane, such as for example a cantilever.

The present invention relates to the use of a shield on a flexible element such as for instance a membrane, and piezo-elements as a sensing element of pressure sensors, but it could be applied to other sensors such as accelerometers, flow, force sensors, etc. These types of sensors use piezo-elements, usually piezo-resistive elements, provided on the flexible element, e.g. membrane. These elements usually comprise a doped region and electric contacts. Although in what follows the term "piezo-resistor" is used, the present invention is not limited to these; any other suitable piezo-element can be used as long as it includes a doped region on a semiconductor. The following description relates to a pressure sensor including piezo-resistors for simplicity, but it could be adapted to any piezo-resistor or -piezo-element based sensor. The present invention provides an extra implant region, forming the shield, on top of piezo-resistive elements. The shield and the doped region of the piezo-resistors have opposite type of doping. The shield reduces the effects of floating charges (which may be influenced by temperature effects of external electric fields). This leads to an improved stability of the sensor output. The shield can also be used to drain all surface charges to substrate, and avoid them reaching the surface of the piezo-resistor. In this way, output drift can be reduced. Compared to other implementations where a layer of material is deposited on the membrane, the present invention does not induce serious thermal of mechanical stress during manufacture, and does not increase the thickness of the substrate and/or membrane. This is achieved by providing the shield through implantation, rather than by growth of layered structures. Further, embodiments of the present invention provide a highly homogeneous membrane, without metallization layer or metal tracks, reducing the effect of metallic electric paths on the sensitivity and the chemical and mechanical stability of the sensing element. In the present invention, the shield is not metallic and the connections comprise regions of degenerated doping levels.

In a first aspect, the present invention relates to a sensor including a membrane, supported by a substrate 11, with a cavity thereunder. The cavity may be a closed cavity, e.g. closed at all sides, for absolute pressure sensing, or an open cavity, e.g. open at the side opposite to the side where the membrane is provided, for relative pressure sensing. The cavity provides thermal and electrical isolation to the membrane, and sufficient room for the membrane to deform in response to an external stimulus (e.g. pressure in case of pressure sensors).

In some embodiments, the membrane may be made from a sheet of material, whereby the membrane is the part of the sheet overlapping the cavity. The sheet of material may include connections and electric paths (such as wires, tracks, pads, metallization layers, vias, printed circuitry) for outputting signals from the piezo-resistors of the membrane, which paths usually are positioned around the area of the sheet used as a sensing element. For example, the electric paths may surround the membrane.

The present invention can be applied to microelectromechanical systems (MEMS), the present invention not being limited thereto.

The membrane may be a semiconductor membrane, such as a silicon membrane. For example, it may be a monocrystalline silicon membrane. The membrane may be epitaxially grown (e.g. epitaxial silicon). The membrane may be thin, for example few microns for low pressure range, or some tens of microns for higher pressures. It may be a thin enough structure that can deform upon application of pressure, which leads to a stress profile change of the membrane. Different technologies can be used for formation of the membrane e.g. KOH etching, DRIE etching, etc.

All or part of the sheet, including the membrane, and the substrate 11 may be obtained from different or the same materials, such as semiconductor materials, e.g. a silicon wafer.

The sensor includes at least one piezo-resistor, for example two, three or four piezo-resistors, or more, depending on the application and design. These piezo-resistors sense a change (deformation on the membrane) and produce as a result a measurable change of electrical properties (change of resistance). Thus, the resistance of a piezo-resistive element changes upon inducing stress on the membrane. Piezo-resistors comprise a region of the membrane which is doped with a first type of doping, for example by implanting an area of a membrane comprising semiconductor material, and optionally the substrate 11. The piezo-resistors may comprise electrical interconnecting elements on the membrane, for example highly doped tracks, e.g. regions with degenerated doping levels. In embodiments of the present invention, "highly doped" means doping levels over $10^{18}$ at/cm$^3$ while "lowly doped" means doping levels under $10^{18}$ at/cm$^3$, for example between $10^{16}$ at/cm$^3$ and $10^{18}$ at/cm$^3$.

In embodiments of the present invention, at least part of the piezo-resistors and optionally the membrane are implanted with dopant atoms of the opposite type than the doping of the piezo-resistors, forming at least one shield. For example, if the piezo-resistors comprise a region of p-type doping, the shield comprises diffused n-type impurity atoms.

The shield may include several disconnected doped areas, for example each piezo-resistor or set of piezo-resistors may include a shield. For example, the shield may be provided only in the area near the edges of the membrane including the piezo-resistors, not being present in the center of the membrane. Providing shield around the piezo-resistor and not all over the membrane ensures that the mechanical properties of the membrane are not significantly affected by the shield (for example, in case of Si-oxide on n-implanted Si, the properties may be affected due to small differences in thickness). In other embodiments, substantially the whole membrane is shielded, including the piezo-resistors. For example, in embodiments of the present invention, the shield can be provided directly on the piezo-resistors and can extend over the area of the membrane, obtaining a regularly doped surface. However, in some embodiments, the shield does not cover highly doped regions, such as those of interconnecting elements, of the membrane. This reduces the chance of early breakdown. This may also reduce leakage current. The shield can specifically also be placed between electric connection paths on the membrane, which may reduce current loss.

According to embodiments of the present invention, the shield may be provided directly on top of the piezo-resistors without interlayer. Due to the fact that two regions with opposite doping are in contact, a charge depletion region is generated at the contact interface. The depth of the shield, measured from the surface (or shield thickness), is smaller than the depth of the doped region of the piezo-resistors, thus the shield can only extend beyond the piezo-resistors laterally, if at all. The shield thickness may be smaller than the distance between the shield and the interface between the doped region of the piezo-resistor and the rest of the membrane (piezo-resistor thickness), thus ensuring that there is enough material in the piezo-resistor to show a good sensitivity. In some embodiments of the present invention, the shield thickness is smaller than 100 nm.

In some embodiments of the present invention, charges floating on the surface of the membrane (at least on top of the piezo-resistors) can be flushed away, by including a connection between the shield and an output or a ground. This connection does not need to be a metallic connection; for example the shield may extend at least slightly outside the membrane, and electric contact between the shield and an external connection or electric path can be provided (via an doped region provided on the sheet, surrounding the membrane; and/or via connection to an electric path on the sheet outside the membrane, further connected to an output or ground). In this way, charges floating on the shield can be flushed away before they reach the first region defining the piezo-resistors and affect the performance thereof. This particular implementation has the advantage that the membrane does not need to include any metal conductor.

In some embodiments of the present invention, the sensor may present resilience against chemical attack and mechanical stress. Thus, it can be used in harsh environments. For example, in some embodiments the sensor may comprise one or more protective layers. For example, the sensor may be covered by a silicon oxide layer and/or a silicon nitride layer. It is an advantage that this type of shield (and sensor) is harsh media compatible, unlike many metal shields.

FIG. 1 shows the layout of an exemplary sensor 100 according to an embodiment of the present invention. The sensor of the figure is a full Wheatstone bridge pressure sensor implemented on a sheet 1, comprising a membrane as flexible structure 101 with four sets of piezo-resistors 2, shown at its edges. The present invention can be applied to other configurations and sensor layouts. In the particular configuration illustrated, a set of piezo-resistors comprises two piezo-resistors, comprising doped regions electrically connected via connection regions 4, for example by a highly doped interconnection regions (e.g. with degenerate doping, e.g. with doping levels over $10^{18}$ at/cm$^3$), provided on the membrane. The piezo-resistors comprise, e.g. are defined by, a lightly doped region, e.g. p-type doping. The sensitivity of this type of piezo-resistors is very high. However, the present invention can be applied to other types of doping, such as n-type doping piezo-resistors, in which case the doping type of the rest of elements would have to be adjusted accordingly.

The sensor comprises a shield 8, e.g. n-type doped shield. The shield covers at least part of the piezo-resistors 2 and most of the membrane 101, except for the connection regions 4 on the membrane 101, which may be highly doped regions, such as for example p++ regions. It also extends over the sheet 1 at least partially beyond the membrane 101. It is beneficial to maximize the area covered with a shielding layer, because that maximizes the protection from ions and/or from external electromagnetic fields. For example, in some embodiments the shield is provided all over the membrane except in the highly doped regions (thus reducing leakage and early breakdown, as described before). It has been found that these highly doped regions, e.g. p++ regions, are less sensitive to external charges than other elements, such as p-wells.

The signals from the piezo-resistor set 2 can be sent to an output. For example, electrical contacts may be provided between the piezo-resistors and the exterior thereof, e.g. signal transmitting means provided on the substrate 11. For example, a highly doped connection region 4 can be provided on the sheet outside the shield 8, in electric contact with the piezo-resistor and with further external connections 7 (e.g. metal tracks, etc.). This way, electrical contact between the piezo-resistor set 2 and bond pads 102 can be established, by providing an electric path between them.

In some embodiments, the region of the sheet 1 between each pair of highly p-doped connection regions 4 may also be covered by n-shield 8. In some embodiments this is important, because otherwise, in some circumstances, surface charges might create an inversion layer between the two highly p-doped interconnects leading to leakage current between them and therefore to output drift. By covering this region with an n-implant shield, no leakage current between two p++ legs is expected, since it is impossible to create a channel below the gate for pnp transistor with +5V on the gate in normal conditions. The legs can be placed close to one another, improving the flexibility of piezo-resistor layout and sensor design.

Further, the shield 8 may have means to flush floating charges on top thereof. In this particular embodiment, the area of the sheet 1 around the membrane 101 has been doped with n-type doping, forming a doped region or well 9, and there is an electric connection between the shield 8 and the doped well 9 around membrane 101. The doped well 9 may be highly doped (with a doping level over $10^{18}$ at/cm$^3$).

For example, the shield 8 may have the same voltage as the part of the sheet 1 around the membrane 101 (e.g. as the potential well 9). For example, the shield 8 may have the highest voltage of the sensor, so it attracts all externally or internally created ions, thus reducing the number of ions reaching the piezo-resistors and therefore reducing or avoiding drifting the sensor output.

Figure 2:
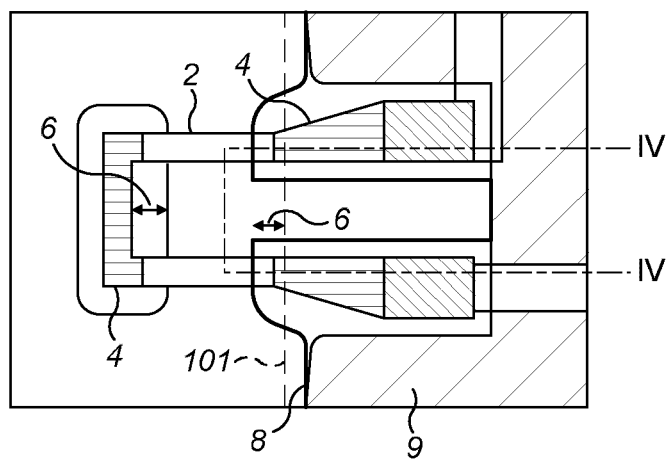
FIG. 2 illustrates a detail of one piezo-resistor set of FIG. 1.

FIG. 2 shows a zoomed-in part of the shielded piezo-resistor, showing one of the piezo-resistor sets 2 in more detail. In this figure, it is clearly shown that the shield 8 does not cover the highly p-doped connection regions 4 (in order to avoid early breakdown between the shield 8 and these interconnect regions 4). The shield is placed at a distance from the interconnect regions 4, leaving a gap 6, which optimizes the shield protection while at the same time reducing chances of breakdown. The required distance or gap width between the shield 8 and the interconnect regions 4 may be within the range of 2 microns to 5 microns, preferably 2.5 µm to 4 µm.

Figure 3:
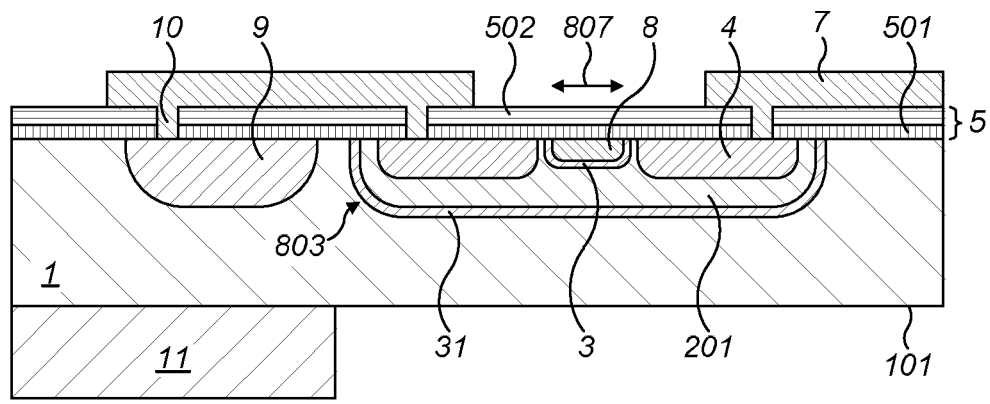
FIG. 3 is a schematic cross section of a sheet for a sensor according to embodiments of the present invention.

FIG. 3 shows a schematic cross section of part of a sheet 1 for a MEMS pressure sensor with n-type shield 8. The part of the sheet 1 not supported by the substrate 11 is the membrane 101. The sheet 1 (and/or membrane) can be formed from semiconductor material, e.g. from monocrystalline silicon, or from epitaxial silicon. The membrane 101 is a thin enough structure that can deform upon application of pressure leading to stress a profile change of the membrane 101.

The piezo-resistor 201 is defined on the membrane 101 by implantation, e.g. by boron (p-type) implantation. The resistance of piezo-resistors 201 changes when the membrane 101 undergoes stress and deforms due to this stress. Any change in the environmental pressure causes deformation in the membrane 101 and therefore an output signal will be generated by the four piezo-resistors 201 placed in a full Wheatstone bridge configuration on the regions close to the edges of the membrane 101, e.g. silicon membrane. This output signal can be sent to a readout device through electrical interconnect regions providing electrical connection between the membrane 101 and for example the substrate 11. For electrical connection of the piezo-resistors 201 on the membrane 101, connection regions 4 can be formed, for example highly boron doped tracks can be provided on the membrane 101. The doping level can be so high that an area of degenerated doping is obtained, with the conductivity close to that of a metal. This way it is possible to avoid using metal for connections on the membrane, to prevent mechanical and thermal hysteresis.

In order to avoid long term drift, nonlinearity and hysteresis issues caused by thin film shield layers, an implant region of different doping type than the piezo-resistors 201, for instance an n-implant region, may be used on the membrane 101 as the shield 8. The shield 8 can for instance be formed by phosphorus ion implantation above at least part of the p-type piezo-resistors. This shield 8 improves the sensor stability by changing the dopant distribution and protecting (shielding) the piezo-resistors 201 from electrical field interference and surface charges.

Embodiments of the present invention generate electromagnetic insulation between the piezo-resistor 201 and the shield 8 without further provision of insulating layer between the shield 8 and the piezo-resistor 201. This is possible because the required insulation is provided by the p/n junction formed in the interface between doped region of the second type, e.g. the n-type doped region, of the shield 8 and the doped region of the first type, e.g. the p-type doped region, of the piezo-resistor 201. Specifically, this insulation is generated because a depletion region 3 forms across any p-n junction, and all free charge carriers diffuse away, or are forced away by an electric field. In embodiments of the present invention, the depletion region 3 provides sufficient electrical isolation between the layers. A further depletion region 31 may form between the p-type piezo-resistors 201 and the rest of the sheet 1, which provides electrical isolation between the piezo-resistors 201 and underlaying substrate of the sheet.

In some embodiments, monocrystalline silicon is used for piezo-resistors, for shielding, and also for the isolation between them. It is possible to avoid the use of an extra layer of insulating material (e.g. Si-oxide or Si-nitride), because the depletion region 3, between the doped region (shield 8) of the second type and the doped region of the first type (piezo-resistors 201), is already insulating. Thus, it is possible to avoid an increase of the thickness of the membrane 101, and to save one deposition step during manufacture, because the extra insulating layer is not needed.

In some embodiments, the distance between the top surface of the membrane 101, being the surface on or in which the piezo-resistors 201 and the shield 8 are provided, and the depletion region 3 between the shield 8 and the piezo-resistor well may be much smaller than the distance between the top surface of the membrane 101 and the interface between the doping region defining the piezo-resistors 201 and the membrane.

Further, a protection layer 5 can be provided. For example, a thin layer of corrosion resistant and/or hard material, such as e.g. silicon-oxide 501 and/or silicon-nitride 502, can be provided on top of the membrane material, e.g. silicon, in order to protect the sensor chemically and physically, against e.g. corrosive elements, mechanical scratches, moisture, etc. For example, a passivation layer can be provided.

Figure 6:
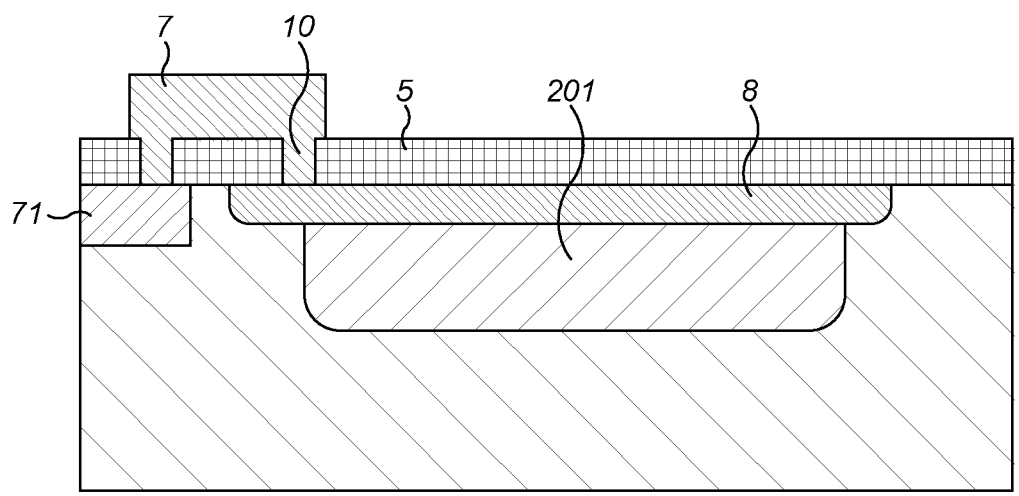
FIG. 6 illustrates a cross section of the sheet, showing an alternative connection between a shield and an external connection, according to embodiments of the present invention.

The electrical paths can comprise any suitable conductive material, for example aluminum or platinum. For example, connections 7 may include a suitable conductor, for example a suitable metal. In some embodiments, external connections may include highly doped connections 71 or tracks provided on the sheet 1, as shown in FIG. 6. Vias 10 can be provided through the protection layer 5, in order to provide contact between different doped regions through connections 7.

Additionally, one or more shield connections to the substrate 11 can be provided in order to flush floating charges from the surface of the piezo-resistor 201. Electrical contact can be provided between the shield 8 and the sensor ground, and/or the output nodes, and/or the well 9.

A particular application of pressure sensors is in harsh media. In case of using chemically resistant metals like platinum, the sensor as shown in FIG. 3 is compatible with harsh media. However, for other metals like aluminum, it may be required to add an extra protection layer, for example a further passivation layer 51 (not illustrated in FIG. 3, but illustrated in FIG. 4), on top of the metallization forming connections 7 in order to make it be compatible with harsh media.

Figure 4:
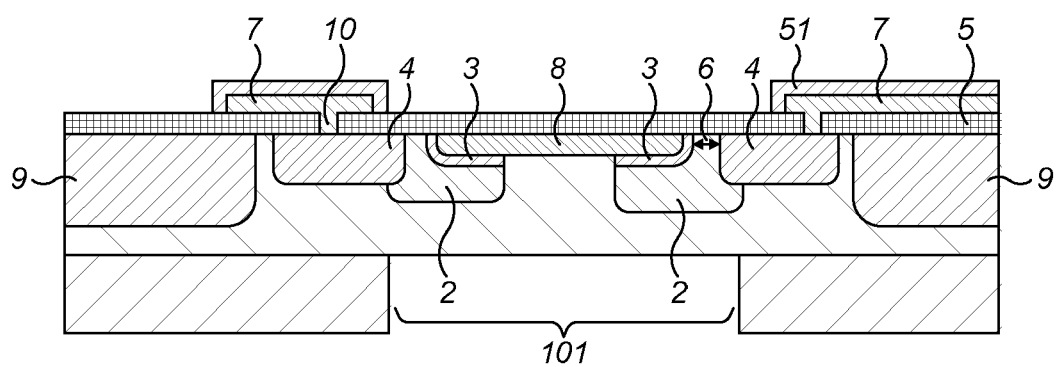
FIG. 4 illustrates a cross section according to IV-IV in FIG. 2.

FIG. 4 shows the cross section IV-IV indicated in FIG. 2. The external connections 7 are directly electrically connected to the connection regions 4 provided with vias 10 through the protection layer 5. A further protection layer 51 has been added on top of the metal of the external connections 7. The shield 8 is provided on the membrane 101, not only on the set of piezo-resistors 2. The figure shows the depletion region 3 between the doped region of the piezo-resistors and the doped region of the shield. The figure also shows the gap 6 between the shield 8 and the highly doped regions which form the connection regions 4. The well 9 is also shown.

Figure 5:
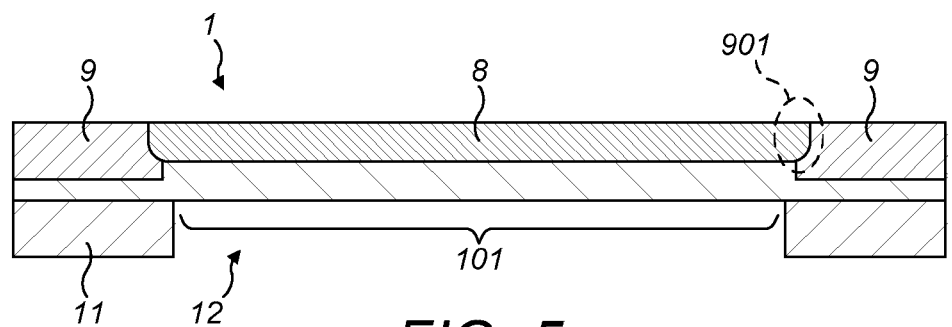
FIG. 5 illustrates a cross section according to V-V in FIG. 1, showing a connection between a shield and a doped well.

FIG. 5 shows the cross section V-V indicated in FIG. 1. In this particular cross section, only the substrate 11 including the cavity 12, and the sheet 1 including the membrane 101 on top of the cavity 12 are shown.

The cavity 12 under the membrane 101 can be either open or closed as already explained. It can provide thermal isolation to the membrane, and/or electrical isolation if needed. The elasticity of the membrane 101, combined with its size and the depth of the cavity, are adapted to provide sufficient room for the membrane 101 to deform in response to an external change (e.g. pressure in case of pressure sensors).

The substrate 11 may offer mechanical support to the membrane 101. For example, the sheet 1 may be attached to the substrate 11. In some embodiments of the present invention where the device may be in contact with harsh and corrosive environment, corrosion protection can be included (for example, an extra shielding) for avoiding separation between the sheet 1 and substrate 11.

The doped well 9 surrounding the membrane 101 is shown. The doped well 9 is provided in the sheet 1, around the zone which forms the membrane 101, but not on the membrane 101 itself. Although it is possible to use the same implant and doping level of the well 9 for the shield 8, the doping profile of the piezo-resistors may be affected (e.g. modulated) with the doping level of the well, so it is preferred to keep the well substantially outside the membrane 101 and, or alternatively, to use a separate implant with very shallow and light doping level for the shield 8. The shield 8 may only electrically contact the well 9 on the edges, and under the shield, only intrinsic doping levels may exist in the regions of the membrane 101 outside the piezo-electric elements. It is apparent that the doped well 9 is provided on the sheet 1 so that there is an electric contact 901 between the shield 8 and the well 9. The level of doping is enough so as to serve as drain for floating charges in the shield 8, but not so large that it reaches degenerated doping levels.

However, also other ways of flushing charges are possible. FIG. 6 shows an alternative way of shield connection to an external connection, for example to the sensor ground or to the output nodes. In particular, FIG. 6 shows a connection between the shield 8 and a degenerate doping connection 71, connected to ground or output, via a connection 7, for example a metal connection and contact vias 10 through an optional protection layer 5. FIG. 6 also shows an embodiment in which the shield 8 extends beyond the doped region, e.g. p-type region, of the piezo-resistor 201. The shield 8 may possibly extend even beyond the membrane 101 and into the part of the sheet supported by a substrate, as also illustrated in FIG. 1, which enables electric contact with no need to provide metal on top of the membrane 101.

In a second aspect of the present invention, a method for manufacturing a sensor, including a shielded membrane, is provided. The method includes providing a piezo-resistor 201 in a membrane 101 by providing a doped region of the membrane 101 with a first doping type. The method includes providing a doped region, defining the shield 8, with a type of doping opposite to the first doping type, at least partially within that first region defining the piezo-resistor 201.

The implementation is fully compatible with existing process flows used for sensor fabrication, with no need of adapted tools or extra layers, or optimization of deposition processes, or special ovens or sputtering processes for this type of shield. Additionally, there is no need to add extra steps of deposition & patterning of an insulation layer between the shield and piezo-resistors. The sheet for a sensor of embodiments of the first aspect is easy to manufacture.

The area between the region of the piezo-resistor 201 and the region of the shield 8 forms a depletion region 3 which advantageously insulates the piezo-resistor 201. Further, means for flushing out floating charges from the shield 8 can be provided.

Figure 7:
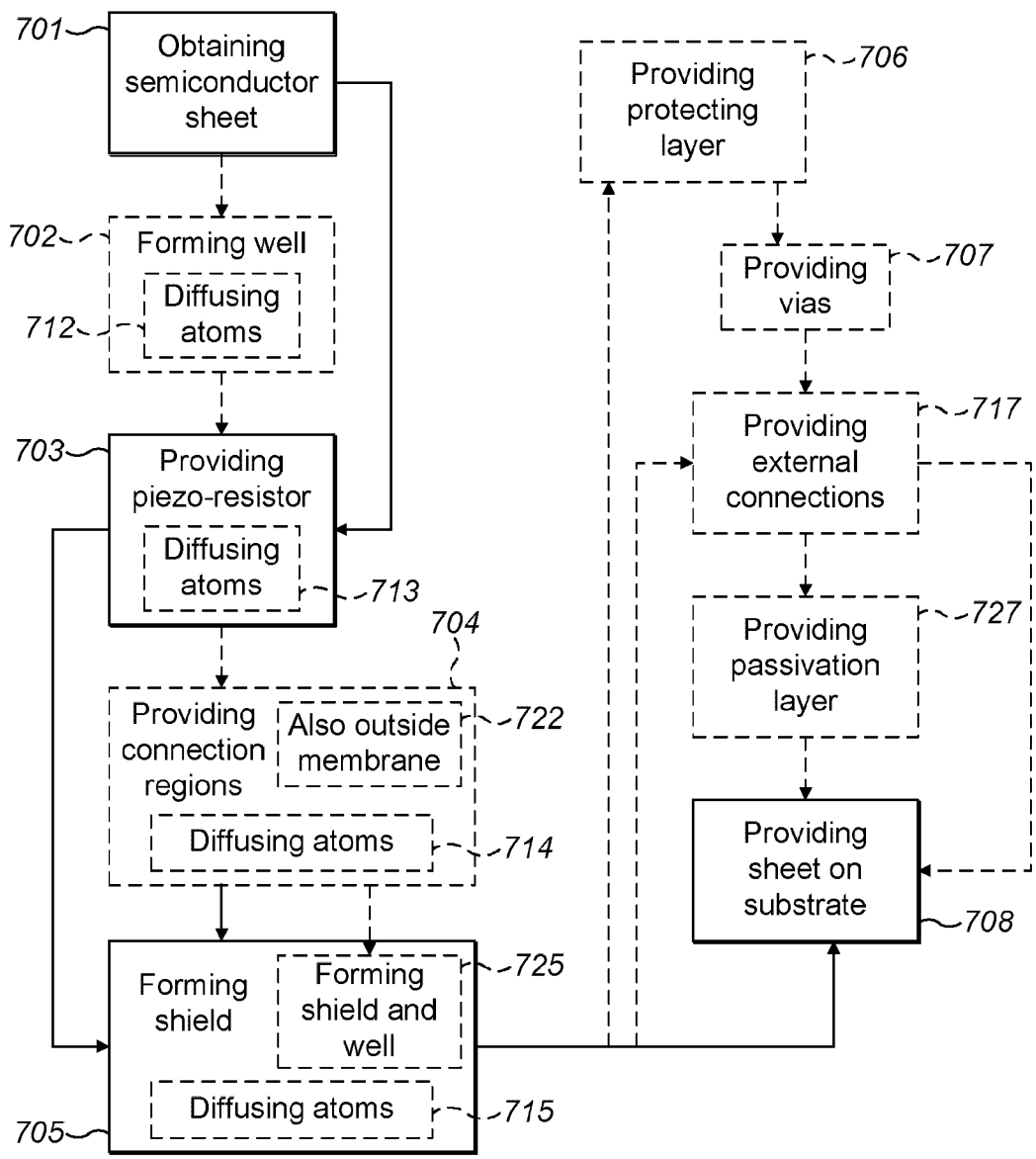
FIG. 7 shows a flowchart of an exemplary method for obtaining a sensor according to embodiments of the present invention.
Figure 8:
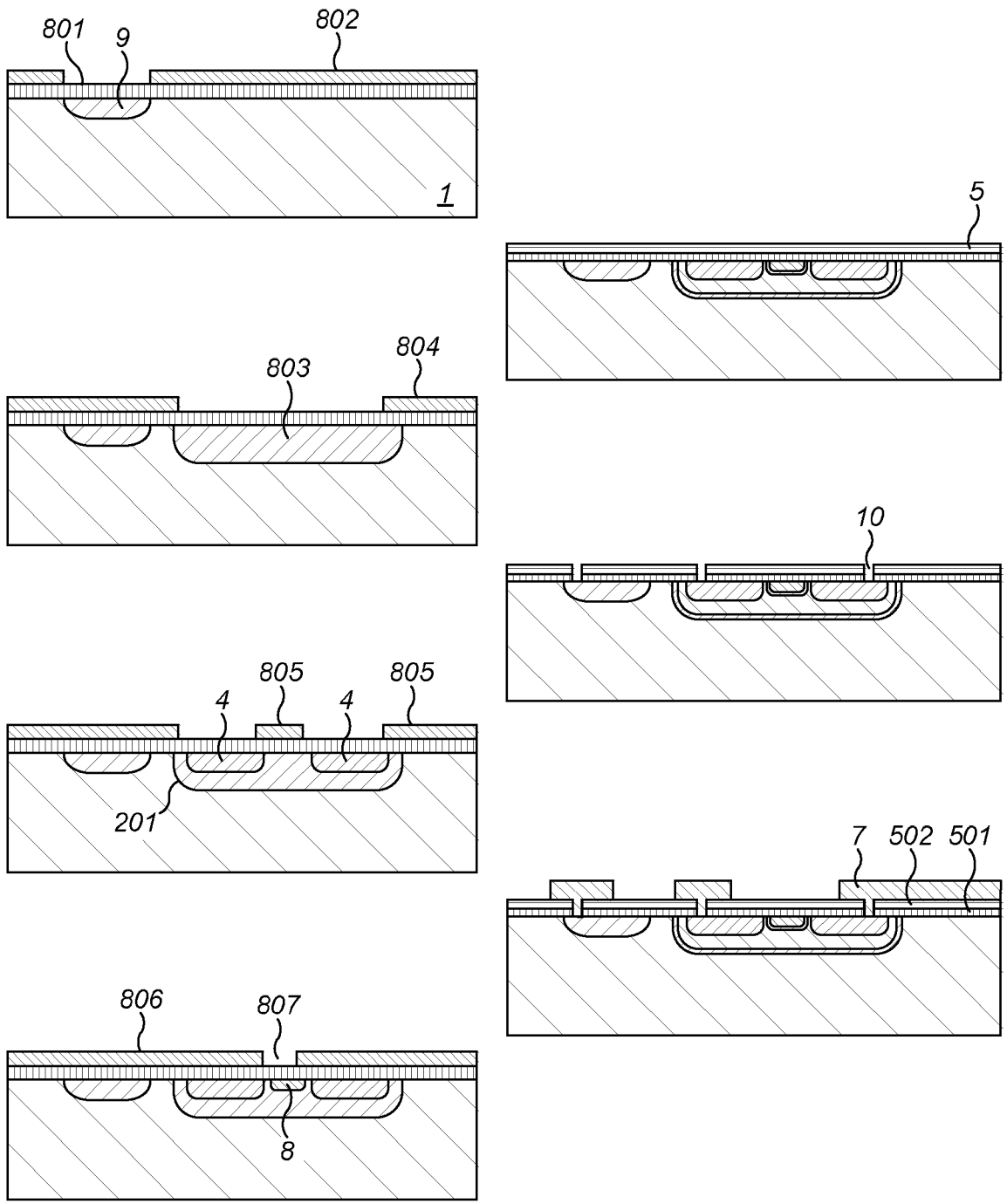
FIG. 8 illustrates different stages of manufacture of a sensor according to embodiments of the present invention.

FIG. 7 is a flowchart outlining steps of an exemplary method of manufacturing a pressure sensor according to embodiments of the present invention. A process flow of manufacturing a sensor with a shield according to some embodiments of the present invention is shown in FIG. 8.

In a first step, the method comprises obtaining 701 a sheet 1 of semiconductor material, for instance a silicon sheet. This sheet 1 of semiconductor material, in the sensor being formed, will form at least a membrane 101 covering an open or closed cavity 12 in a substrate 11.

In a first region of the sheet 1, at least one set 2 of piezo-resistors 201 is provided 703. The piezo-resistors 201 of the sets 2 can be provided, for example, by providing dopant atoms of a first type, e.g. providing a lightly p-doped region 803 (e.g. with doping levels between $10^{16}$ to $10^{18}$ atom/cm$^3$), for example by implanting and diffusing 713 the dopant atoms, such as boron atoms on a silicon membrane. Thus, standard CMOS technology can be readily used in embodiments of the present invention, although the present invention is not limited to these exemplary materials. Obtaining the region 803 for the piezo-resistors may include removing areas, e.g. by etching, of a masking layer or photoresist pattern layer 804 provided on top of the sheet.

A shield 8 is provided 705, comprising dopant atoms of a second type, opposite to the first type (e.g. n-type atoms), for instance by implantation and diffusion 715, on a second region 807 of the sheet 1 at least partially overlapping the first region 803. Thereby a charge depletion layer 3 is generated by the shield 8 between the doped first region and the doped second region, for shielding against disturbances.

The range for implantation dose (concentration of implanted dopants per area) of n-implant for the shield can be 1 $e^{13}$ at cm$^{-2}$ to 5 $e^{16}$ at cm$^{-2}$. The range for implantation dose for the sheet and the piezo-resistors may be 5 $e^{13}$ at cm$^{-2}$ to 3 $e^{15}$ at cm$^{-2}$. The doping concentration of the piezo-resistor should be higher than the doping concentration of the sheet. However, the doping concentration of the piezo-resistor should not be so high that the breakdown voltage between piezo-resistor and shield is reached. The thus processed sheet 1 is provided 708 on a substrate 11 with a cavity 12, such that at least the first region of the sheet 1 covers the cavity, thereby obtaining a membrane 101 as sensing element of the pressure sensor 100.

The present invention is not limited to the above steps, and further optional steps may be included, shown in the flowchart of FIG. 7 with dashed boxes and arrows. For example, obtaining 701 a semiconductor sheet may include obtaining or providing a semiconductor sheet with intrinsic doping levels. For example, the method may include providing a dielectric surface 801. For example a first layer 801, with a predetermined thickness of for example 240 nm, of a predetermined dielectric material such as for instance Si-oxide, is obtained on a semiconductor wafer, for instance a silicon wafer, for example by deposition. At the end of the process, the remaining of the dielectric surface 801 may be used as part of the protection layer 5 (for example, it may form the silicon oxide layer 501).

In embodiments of the present invention, the method may include forming 702 a well 9 in the sheet 1, outside the region to be used as the membrane 101. The well 9 may be provided, for example, all around the region to be used as the membrane 101, for example completely enclosing it.

Forming the well 9 may include forming and patterning a photoresist pattern layer 802, implanting and diffusing 712 the dopant atoms, for example by thermal diffusion, although any suitable doping technique can be used. This step can be performed in a later stage, for example while providing 705 the shield 8. The well may be formed by deposition of dopant atoms of the same type as the shield (e.g. n-type dopant atoms), being the type opposite to the first dopant atoms of the piezo-resistors. In some embodiments, the obtained well may be a highly doped well 9.

In embodiments of the present invention, the step of providing 703 the piezo-resistor may include providing all the sets of piezo-resistors simultaneously. This step can be performed after forming 702 the well 9 as shown in FIG. 8, or alternatively immediately after providing 701 the semiconductor sheet, for example if the well 9 is not provided, or for example if the well 9 is provided 725 together with the shield 8, in a later step.

In embodiments of the present invention, the method may include providing 704 connection regions 4 for providing electric contact between different parts of the sensor. For example, the method may include providing connection regions 4 in the region 803 of the membrane for forming the piezo-resistors. For example, connection regions 4 on the membrane may be provided 704 by providing dopant atoms of the first type in a sub-region of the first region, thereby generating regions with degenerated doping levels, so they can act as metal contacts on the membrane (without actually using metallic material thereon). For example, these can be formed by implanting and diffusing 714 dopant atoms of the same doping type as the piezo-resistor. A suitable masking layer 805 can be used. In some embodiments, the same dopant atoms are used as the piezo-resistor, but at a higher doping level. However, any other suitable dopant atoms can also be used.

Immediately after or simultaneously with the step of providing 704 connection regions 4 in the membrane, further connections 71 may be provided 722 on the sheet in the region outside the membrane (not shown in FIG. 8, but shown in FIG. 6). These regions 71 may also have degenerated doping levels. They can be formed by doping implantation or deposition, for example high doping implantation. These regions 71 may have the same type of atoms or type of dopant atoms as the connection regions 4 on the membrane, although they may be different. If the contact regions 4 in the membrane and the connection regions 71 outside the membrane are provided simultaneously, the step of diffusing 714 the atoms may be common to both, thus saving time.

The connection regions 71 outside the membrane may be connected to the piezo-resistors, for example to the connection regions 4 of the piezo-resistors, when suitable. For example, a metallic connection may be provided 707, 717 in a later step.

In some embodiments, however, these external connections 71 may be provided at any suitable other moment, for example at the time of providing 703 piezo-resistors.

In order to provide 704 connection regions, a suitable masking layer 805 can be used.

Once the piezo-resistors are formed 703, optionally also after forming 704 connection regions 4, the shield 8 can be provided 705. In some embodiments of the present invention, there is no need to provide a passivation layer and/or isolation layer between piezo-resistors and the shield, which advantageously improves its shielding performance. Hence, there is no need of complex adaptations of deposition devices and furnaces or methods. As shown in FIG. 8, further masking layers or pattern layers 806 can be used for providing the shield.

As an exemplary embodiment, for a silicon sheet, p-type dopant atoms, e.g. boron atoms, may be used for providing 703 the piezo-resistors, while n-type dopant atoms, e.g. phosphorus atoms, can be used for forming 705 the shield 8. Doping with phosphorous is easy to implement in well-known manufacturing routines; however, the present invention is not limited to phosphorous, and other types of n-type implantation can be used, such as arsenic or antimony. The higher the dopant dose, the narrower is the depletion region in the junction and the lower is the breakdown voltage between piezo and n-shield. Therefore, a lower dose is preferred for the n-shield to avoid early breakdown between p-type piezo-resistors and the n-shield. However, a lower dopant dose means lower conductivity of the shield; therefore there is a trade-off between conductivity of the shield and the breakdown voltage. For example, the implantation dose of this n-implant, e.g. phosphorous, can be between 1 $e^{13}$ at $cm^{-2}$ to 5 $e^{16}$ at $cm^{-2}$, for example between 5 $e^{13}$ at $cm^{-2}$ to 5 $e^{15}$ at $cm^{-2}$. Other suitable doses can also be used.

As already mentioned, it is also possible to combine the step of providing the shield 8 with the step of forming the well 9 around the membrane 101. The combined deposition may be performed so charges can be flushed away from the shield 8 through the well 9. For example, this can be performed by obtaining a suitable masking or pattern layer for providing 725 both the shield 8 and the well 9 around the membrane 101 in one step, with only one implantation of atoms of the second doping type. As before, the step of diffusing 715 atoms may be common to the shield 8 and the well 9 if both are obtained simultaneously.

At this point, the sheet 1 may be placed on a substrate 11 including a cavity 12, the part of the sheet 1 covering the cavity 12 thus forming the membrane 101.

In some embodiments, after the shield is provided, a protection layer 5 can be provided 706. For example a further protection layer can be deposited, for providing chemical and/or mechanical resistance to the sensor. A particular example of such protection layer, the present invention not being limited thereto, is a 150 nm Si-nitride layer 502 which can be deposited using a standard Si-nitride deposition method such as LPCVD. For example, protection layer 5 may include a Si-oxide layer 501, which may have been obtained as the dielectric layer 801 on the sheet.

In some embodiments of the present invention, the method may further comprise providing electrical paths between different parts of the sensor. For example, the contacts to substrate can be opened 707 in the protection layer 5 (e.g. through Si-nitride and Si-oxide) by providing vias 10, and metal for routing can be deposited and patterned, providing 717 external connections 7, in order to have the required electrical pathing between the piezo-resistors and bond pads.

Further connections, such as connection in Wheatstone bridge, connection to a VDD, can be added by providing suitable metallic connections 7.

In some embodiments, as shown in FIG. 6, an electrical contact can be provided between the shield and an output, for example by a via 10, a metallic connection 7 and a degenerate doping connection 71. It is preferred that no metal is provided on the membrane; in this case the shield extends on the sheet, outside the membrane, enough so a connection, e.g. a metal connection, can be provided without affecting the region to be used as a membrane 101.

However, in some embodiments, there is no need to add an extra process step to create electrical contact between the shield 8 and the substrate, if the well 9 is suitably provided. By providing direct contact between the shield and the well, floating charges of the shield can be flushed away through the well 9. Since both of them are at the same layer, the electrical contact can be created by just overlapping the shield layer with the well, e.g. the n+ doped well 9, around the membrane. This can be obtained by providing the well 9 in electric contact with the shield 8. In some embodiments, this is obtained by providing 725 the shield 8 and well 9 simultaneously.

In some embodiments, a further passivation layer may be provided 727 in order to protect these external connections from the environment. This is advantageous in manufacture of sensors for automotive applications, which are often in contact with corrosive chemicals. The passivation layer allows using non-noble metals such as aluminum, which is cheaper than e.g. gold or platinum, for said applications with harsh environments.

Providing the sensor may include other step such as processing the sheet 1 from a silicon wafer, for example including thickness reduction, singulation, etc. Further metallization layers can be included in the substrate, as well as further electric connections between the sheet and the substrate, if needed. At this point, the sheet can be provided 708 on top of a substrate including a cavity.

Manufacture processes according to embodiments of the present invention can provide a shielded sensor using well-known and established CMOS manufacturing routes, which can be performed in a standard fab, just by adjusting the dose and energy of the implant for the shield.

In summary, according to embodiments of the present invention, a sensor can be obtained with EM shielding, the sensor being harsh media compatible, unlike other shields such as many metal shields. The shield of the present invention can flush away floating charges on top of the membrane, without necessarily adding an extra substrate contact. It is not necessary to provide a further layer of material on top of the membrane, but to provide a doping region, so the increase of thickness of the membrane (and the corresponding sensitivity drop) is negligible. Moreover, the depletion region acts as electric insulation between the sensing element (at least the piezo-resistors) and the shield and advantageously reduces or avoids the negative effect of external charges on the piezo-resistors, and therefore sensor output drift, with no need of an extra dielectric layer (such an oxide layer, which would affect the non-linearity and sensitivity of the sensor). Providing a shielding directly on top of the piezo-resistors, rather than on top of an extra dielectric layer, improves the efficiency of the shielding. Unlike other types of shield layers, this type of shielding does not induce any initial stress in the membrane, even on delicate materials such as semiconductor membranes; no high temperature processing is needed. The modulus of elasticity of the shield may be similar to the Young's modulus of the sensing element, so the sensor does not suffer from mechanical and thermal hysteresis. Hence, there is no effect of residual stress in shield on sensitivity and non-linear characteristics of the sensor. Long term drift of sensitivity is also reduced.

The shield provides the best protection when its coverage over the sensor is maximized. Therefore the shield is preferably patterned in a way (e.g. by masking) to exclude the shield only over the highly doped regions to avoid very early breakdown of the device. These highly doped regions have very high electrical conductivity, they are less sensitive to external charges than the lightly doped regions which are used as sensing elements, so they are advantageously used for interconnection and electric paths, especially on the membrane, to avoid thermal hysteresis of metals due to plastic deflections.

Despite the thickness of the shield, which occupies a volume on the membrane, pushing the piezo-resistor deep down the thickness of the membrane, there is a small change on the stress change on the middle of the membrane, lower than on top. However, this small sensitivity drop is compensated by the overall high sensitivity of the shield, and this effect can also be further reduced by design.

The invention claimed is:

1. A piezo-resistor-based sensor comprising at least a sensing element provided on a flexible structure, the sensing element comprising at least one piezo-resistor comprising at least a first doped region of the flexible structure doped with dopant atoms of a first type,
    wherein the flexible structure furthermore comprises a second doped region, the second doped region at least partially overlapping the first doped region such that a shield is formed that shields the sensing element from external electrical field interference,
    wherein dopant atoms of the second doped region are of a second type opposite to the type of dopant atoms of the first doped region, for generating a charge depletion layer within the flexible structure at the overlapping region between the first doped region and the second doped region, and
    wherein a depth of the shield measured from a surface of the flexible structure is smaller than a depth of the first doped region of the at least one piezo resistor.

2. The sensor according to claim 1, wherein the second doped region extends over the area of the flexible structure outside the first doped region, overlapping at least part of the flexible structure outside the first doped region of the piezo-resistors.

3. The sensor according to claim 1, wherein the sensing element comprises the first doped region comprising silicon doped with boron, and wherein the shield comprises the second region doped with phosphorus.

4. The sensor according to claim 1, wherein the shield is in electrical contact with an exterior of the flexible structure.

5. The sensor according to claim 1, wherein the shield is not covering areas adjacent to highly doped regions of the flexible structure, used for interconnection with the piezo-resistors.

6. The sensor according to claim 1, further comprising a protective layer comprising corrosion resistant material provided on top of at least the flexible structure.

7. A method of manufacturing the piezo-resistor-based pressure sensor according to claim 1, the method comprising:
    providing at least a piezo-resistor comprising dopant atoms of a first type in a first doped region of a sheet of material,
    providing a shield comprising dopant atoms of second type, opposite to the first type, in a second region of the sheet at least partially overlapping the first doped region thereby generating a charge depletion layer between the first doped region and the second doped region, for shielding against disturbances, providing the sheet on a substrate with a cavity, such that at least the first doped region of the sheet overlaps the cavity such that obtaining a flexible structure is obtained as a sensing element of the pressure sensor.

8. The method according to claim 7, wherein providing the piezo-resistors comprises implanting and diffusing the dopant atoms of the first type, and wherein providing the shield comprises implanting and diffusing dopant atoms of the second type.

9. The method according to claim 7, further comprising providing a doped well around the flexible structure, and providing an electric contact between the well and the shield.

10. The method according to claim 9, wherein providing the shield comprises providing dopant atoms of the second type in the second doped region of the sheet simultaneously with providing the doped well.

11. The method according to claim 7, wherein providing the shield comprises providing dopant atoms in a region extending throughout a predetermined area of the sheet, overlapping at least part of the sheet outside the first doped region.

12. The method according to claim 7, further comprising providing connection regions in a sub-region of the first doped region, and wherein providing the shield comprises leaving a gap between the second region and the connection regions.

13. The method according to claim 7, further comprising providing connections and electrical paths in the zones of the sheet in contact with the substrate, outside the flexible structure, by providing highly doped regions.

\* \* \* \* \*